United States Patent [19]

Amano

[11] 4,182,991
[45] Jan. 8, 1980

[54] CHANNEL SELECTING APPARATUS FOR USE WITH PLURAL TUNING DEVICES

[75] Inventor: Toshio Amano, Tokyo, Japan

[73] Assignee: Sony Corporation, Tokyo, Japan

[21] Appl. No.: 934,040

[22] Filed: Aug. 16, 1978

[30] Foreign Application Priority Data

Aug. 17, 1977 [JP] Japan .................. 52-98552

[51] Int. Cl.² ............................................. H04B 1/16
[52] U.S. Cl. ........................... 325/459; 179/100.11; 325/464; 360/33
[58] Field of Search .................... 358/191, 4; 325/453, 325/459, 464, 465, 468, 25, 311; 179/100.11; 360/33, 137; 331/46, 48, 55, 56

[56] References Cited

U.S. PATENT DOCUMENTS

| | | | |
|---|---|---|---|
| 3,699,359 | 10/1972 | Shelby | 325/465 |
| 4,031,548 | 6/1977 | Kato et al. | 179/100.11 |

*Primary Examiner*—Marc E. Bookbinder
*Attorney, Agent, or Firm*—Lewis H. Eslinger; Alvin Sinderbrand

[57] ABSTRACT

Channel selecting apparatus for use with at least first and second tuning devices, each tuning device being responsive to a channel selecting signal supplied thereto for being tuned to a corresponding frequency. At least first and second selectors are provided for producing first and second selector signals, respectively, representing those channels to which the first and second tuning devices are tunable. A set of adjustable elements, common to all of the tuning devices are settable to produce respective channel selecting signals. At least first and second sampling circuits, associated with the first and second tuning devices, respectively, are responsive to first and second phases, respectively, of a switching signal to sample a channel selecting signal applied thereto. A set of switching circuits is provided, each switching circuit being coupled to a respective one of the adjustable elements to receive a respective first selector signal and a respective second selector signal. Each switching circuit is conditioned by the first phase of the switching signal to enable the channel selecting signal produced by the adjustable element coupled thereto to be applied to the first sampling circuit if a first selector signal is supplied thereto, and each switching circuit is conditioned by the second phase of the switching signal to enable the channel selecting signal produced by the adjustable element coupled thereto to be applied to the second sampling circuit if a second selector signal is supplied thereto. The channel selecting signals sampled by the first and second sampling circuits are applied to the first and second tuning devices, respectively.

17 Claims, 8 Drawing Figures

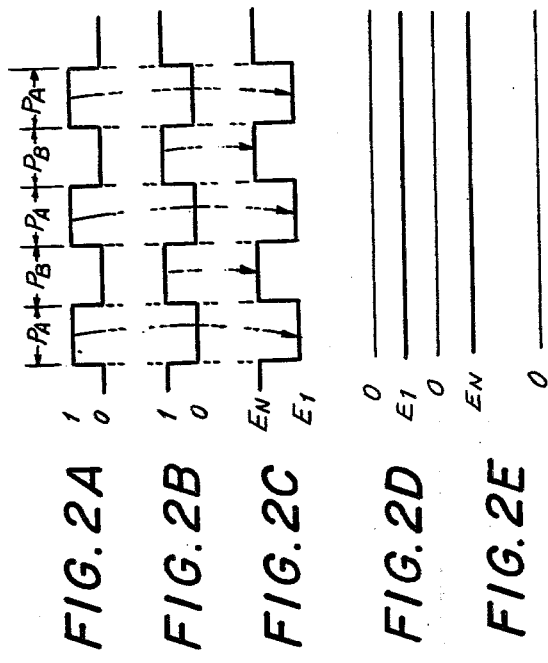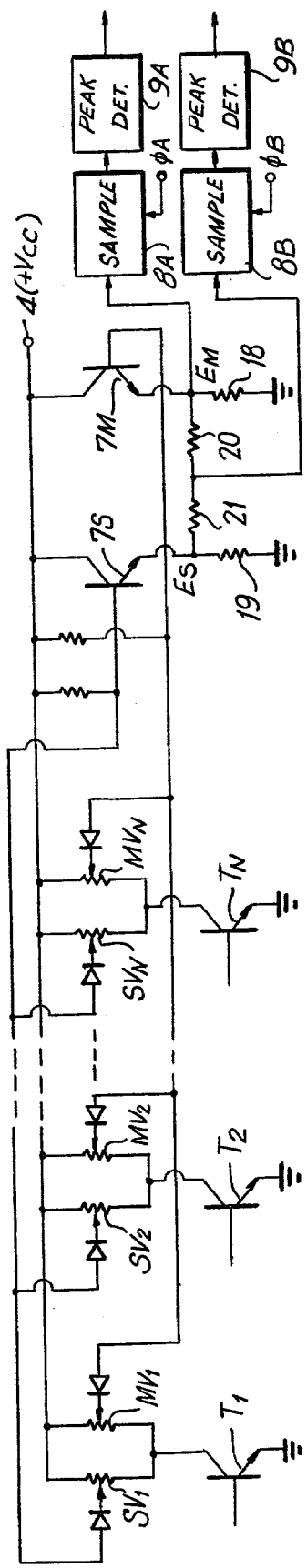

CHANNEL SELECTING APPARATUS FOR USE WITH PLURAL TUNING DEVICES

BACKGROUND OF THE INVENTION

This invention relates to channel selecting apparatus for use with plural tuning devices and, more particularly, to such apparatus wherein the particular channels to which the respective tuning devices are tuned are determined by channel selecting signals which are produced by a set of adjustable elements which are common to all of the tuning devices.

Electronic tuning devices are known wherein the usual mechanical or electro-mechanical elements which heretofore had been provided for tuning a tuner to a particular frequency or channel are replaced by controllable reactive elements, such as voltage-controlled capacitors, known as varicaps. With such an electronic tuner, control voltages can be selectively supplied to the voltage-controlled capacitor merely by selectively operating appropriate switches. Thus, for a radio receiver, such as an AM or FM receiver, which includes an AM or FM tuner, an individual switch, such as a pushbutton switch, can be provided for each broadcast frequency which is available in a geographical location and to which the AM or FM tuner can be tuned. For a television receiver, the electronic tuner may be provided with pushbutton switches for each broadcast channel in, for example, the VHF band, together with a number of additional pushbutton switches which may be associated with selected UHF channels to which the television receiver can be tuned.

In electronic tuners of the foregoing type, that is, electronic tuners for use in AM, FM or television receivers, an adjustable element, such as a potentiometer or other adjustable resistance, is connected to each pushbutton switch and is settable to derive a control voltage of predetermined magnitude, which control voltage is supplied, when the associated pushbutton switch is operated, to the tuner. For example, for a television receiver, the pushbutton switch which is associated with channel 2 also is associated with an adjustable element which is set to provide a control voltage that, when supplied to the voltage-controlled capacitor included in the tuner, tunes that tuner to channel 2. Similarly, the pushbutton switch which is associated with channel 3 also is associated with an adjustable element which is set to provide a control voltage which, when supplied to the voltage-controlled capacitor included in the tuner, tunes that tuner to channel 3. The remaining pushbutton switches are similarly associated with adjustable elements which are set to provide other control voltages for setting the tuner to other, desired channels.

As is known, video recording devices, such as a video tape recorder (VTR) includes a tuner whereby the VTR can be tuned to a desired broadcast channel for recording. Typically, the VTR, although operable independently of a monitoring television receiver, often may be used with that receiver in order to permit the viewer to determine the particular program, or information, which is being recorded. Once a viewer confirms that the program which is being recorded is a desired program, he may wish to view other broadcast programs while not interfering with the VTR recording operation. Accordingly, in order to provide this feature, both the television receiver and the VTR are provided with separate tuning devices and, moreover, separate controls are provided for these tuning devices. If such tuning devices are electronic tuners of the aforedescribed type, this means that a separate set of channel selector switches is provided for each tuning device and, moreover, a separate set of adjustable elements, such as a separate set of potentiometers, also is provided for each tuning device.

While electronic tuners provide a significant improvement over mechanical or electro-mechanical tuners, both in performance characteristics and in lower cost of manufacture, a substantial portion of the overall cost of the electronic tuner resides in the adjustable elements. Thus, it is desirable to provide a single set of adjustable elements which can be used to produce channel selecting signals both for the electronic tuner in the television receiver and the electronic tuner in the VTR. It is further desired to avoid any limitation on the independent operation of both electronic tuners, even though a single set of adjustable elements is provided therefor. That is, it is desired to enable the electronic tuner included in the television receiver to be tuned to one broadcast channel while the electronic tuner included in the VTR can be tuned to the same or a different broadcast channel for recording.

OBJECTS OF THE INVENTION

Therefore, it is an object of the present invention to provide improved channel selecting apparatus for use with two or more electronic tuners which is of relatively low cost and which is of simple construction.

Another object of this invention is to provide channel selecting apparatus for use with two or more electronic tuners wherein a single set of adjustable elements is provided in common with all tuners, and wherein the adjustable elements are individually settable to produce respective channel selecting signals which are supplied to corresponding ones of the electronic tuners.

A further object of this invention is to provide channel selecting apparatus for use with two or more electronic tuners, wherein one set of selector switches is provided for one tuner and another set of selector switches is provided for the other tuner, but only a single set of adjustable elements is provided for both tuners, each adjustable element being settable to produce a respective channel selecting signal, and particular ones of the channel selecting signals being supplied to the tuners in accordance with the operation of the selector switches in each set.

An additional object of this invention is to provide channel selecting apparatus for use with two or more electronic tuners wherein a single set of selector switches and a single set of adjustable elements are provided to determine the tuning condition of both tuners concurrently, and wherein an inhibit switch is provided to lock the tuning condition of one tuner to an existing condition while permitting the set of selector switches to be further operated so as to change the tuning condition of the other tuner.

Various other objects, advantages and features of the present invention will become readily apparent from the ensuing detailed description, and the novel features will be particularly pointed out in the appended claims

SUMMARY OF THE INVENTION

In accordance with this invention, channel selecting apparatus is provided for use with at least first and second tuning devices, each tuning device being respon sive to a channel selecting signal supplied thereto for being tuned to a corresponding frequency. At least first and second selectors are provided for producing first and second selector signals, respectively, representing those channels to which the first and second tuning devices are tunable. A set of adjustable elements, common to all of the tuning devices, are individually settable to produce respective channel selecting signals. At least first and second sampling circuits are associated with the first and second tuning devices, respectively, and the sampling circuits are responsive to first and second phases, respectively, of a switching signal to sample a channel selecting signal applied thereto. A respective switch is coupled to a respective adjustable element and is supplied with a corresponding one of the first selector signals as well as a corresponding one of the second selector signals. Each switch is conditioned by the first phase of the switching signal to enable the channel selecting signal produced by the adjustable element coupled thereto to be applied to the first sampling circuit if the switch receives a first selector signal. Each switch is further conditioned by the second phase of the switching signal to enable the channel selecting signal produced by the adjustable element coupled thereto to be applied to the second sampling circuit if that switch receives a second selector signal. The channel selecting signals sampled by the first and second sampling circuits are applied to the first and second tuning devices, respectively, so as to establish the respective tuning conditions therefor.

BRIEF DESCRIPTION OF THE DRAWINGS

The following detailed description, given by way of example, will best be understood in conjunction with the accompanying drawings in which:

FIGS. 2A–2E are waveform diagrams which is useful in explaining the operation of the embodiment shown in FIG. 1;

FIG. 4 is a schematic diagram of a modification of a portion of the apparatus in accordance with the present invention.

DETAILED DESCRIPTION OF SOME PREFERRED EMBODIMENTS

Figure 1:
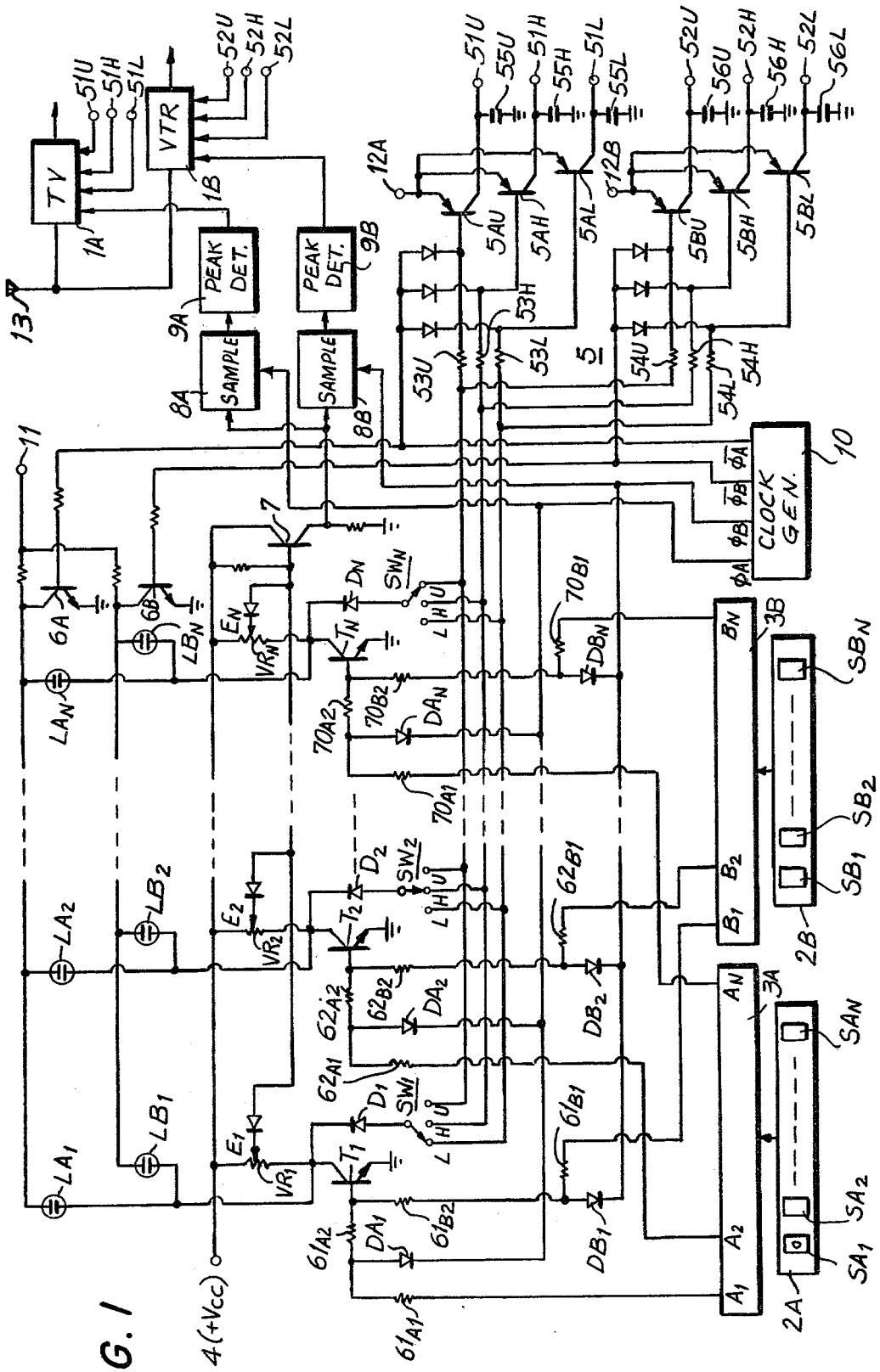
FIG. 1 is a partial block, partial schematic diagram of one embodiment of the present invention.

Referring to the drawings, wherein like reference numerals are used throughout, and in particular to FIG. 1, there is illustrated one embodiment of the present invention which, for the purpose of the present discussion, is shown as being used with electronic tuners for a television receiver and a VTR, respectively. However, and as will be appreciated, the present invention can be used with electronic tuners provided in AM or FM radio receivers, or other signal receiving devices. Furthermore, although only two tuning devices are shown for the purpose of simplification, the present invention can be used with more than two such tuning devices. A detailed illustration of the respective tuning devices is not shown. It should be appreciated that such tuning devices may be of conventional construction and are normally included in television receiver 1A and in VTR 1B. For example, each electronic tuner may include a voltage-controlled capacitor which is connected in an oscillating circuit with an inductor, whereby the frequency of the signal generated by the oscillating circuit is a function of the capacitance of the voltage-controlled capacitor. This oscillating signal is supplied to a mixer wherein it is mixed with the incoming signals which are supplied to television receiver 1A and VTR 1B by, for example, an antenna 13, to derive an intermediate frequency (IF) signal. The particular channels to which the television receiver and VTR are tuned are determined by the frequency of the oscillating signal which, in turn, is selected by the voltage applied to the respective voltage-controlled capacitors. More particularly, and as is appreciated, each electronic tuner included in television receiver 1A and VTR 1B is capable of being tuned to a channel frequency included in the low-band or high-band of the VHF broadcast spectrum, and also the UHF-band of the broadcast spectrum. In this regard, band-select inputs 51L, 51H and 51U are coupled to the tuner of television receiver 1A, and band-select inputs 52L, 52H and 52U are coupled to the tuner included in VTR 1B. Depending upon whether a low-band, high-band or UHF-band select signal is supplied to low-band select inputs 51L, 52L, high-band select inputs 51H, 52H and UHF-band select inputs 51U, 52U, respectively, the tuners included in the television receiver and VTR are correspondingly tuned to a frequency included in the low-, high-, or UHF-band. Separate inductors may be connected to the voltage-controlled capacitors as a function of the particular band-select signal which is supplied to the electronic tuner.

Although the foregoing has described the electronic tuner as being comprised of a controllable oscillator coupled to a mixer, the tuner alternatively may include a voltage-controlled filter. Such a filter includes a voltage-controlled capacitor connected with an inductor. The filtering characteristics of such a filter are determined by the capacitance of the voltage-controlled capacitor, as well as the inductance of the inductor. Thus, the tuning condition of such a filter is controlled by the voltage applied to the voltage-controlled capacitor and by the particular inductor which is connected thereto.

The channel selecting apparatus illustrated in FIG. 1 is comprised of a set of channel selector switches 2A, a set of channel selector switches 2B, a storage device, such as a memory 3A, for storing selector signals, a storage device, such as a memory 3B, for storing selector signals, adjustable elements $VR_1 \ldots VR_N$, switching transistors $T_1 \ldots T_N$, a source of switching pulses, such as a clock generator 10, sampling circuits 8A and 8B and peak detectors 9A and 9B. It will be assumed, for the purpose of the present discussion, that the tuners included in television receiver 1A and in VTR 1B are capable of being tuned to N individual channel frequencies. Accordingly, the set of selector switches 2A is provided with N mutually exclusively operable switches $SA_1, SA_2, \ldots SA_N$, and the set of selector switches 2B likewise is comprised of N mutually exclusively operable switches $SB_1, SB_2, \ldots SB_N$. Each switch in each set of selector switches may be a push-button switch and only one such switch in each set can be operated at any given time. Of course, a switch in one set can be operated while the same or a different switch in the other set is operated. The set of selector switches 2A is associated with television receiver 1A, and the set of selector switches 2B is associated with VTR 1B. That is, and as will be described in detail hereinafter, the tuner included in the television receiver is tuned to the particular channel which is selected by the operation of a particular switch included in the set 2A; and the tuner included in the VTR is tuned to the particular channel which is selected by the operation of a switch included in the set 2B. In the description to follow, all elements which are identified with a reference numeral containing the suffix A are associated with the tuner included in television receiver 1A, and elements identified by reference numerals which contain the suffix B are associated with the tuner included in VTR 1B.

Storage circuits 3A and 3B each include N storage compartments for storing a respective one of N selector signals which are supplied thereto by the sets of switches 2A and 2B, respectively. For example, when switch $SA_1$ is operated, a selector signal is supplied therefrom to the first storage compartment included in storage circuit 3A. If switch $SA_2$ is operated, the second storage compartment stores a selector signal. The remaining storage compartments in storage circuit 3A, as well as all of the storage compartments included in storage circuit 3B function in a similar manner to store respective selector signals. Each storage compartment may be comprised of a latching circuit, and only one latching circuit in each storage circuit can be latched to store a selector signal at any given time. Storage compartment 3A is provided with N output terminals $A_1$, $A_2$, ... $A_N$ for providing the particular selector signal thereat which is stored in the associated storage compartment. Similarly, storage circuit 3B is provided with N output terminals $B_1$, $B_2$, ... $B_N$ for providing the particular selector signal which is stored in the associated storage compartment of this storage circuit.

Transistor switches $T_1$ ... $T_N$ are coupled to output terminals $A_1$ ... $A_N$ and to output terminals $B_1$ ... $B_N$, respectively. More particularly, the base electrode of transistor $T_1$ is coupled to output terminal $A_1$ by series-connected resistors $61_{A1}$ and $61_{A2}$. The base electrode of this transistor also is coupled to output terminal $B_1$ by series-connected resistors $61_{B1}$ and $61_{B2}$. The base electrode of transistor $T_2$ is coupled to output terminal $A_2$ by series-connected resistors $62_{A1}$ and $62_{A2}$. The base electrode of this transistor also is coupled to output terminal $B_2$ by series-connected resistors $62_{B1}$ and $62_{B2}$. The remaining transistor switches are connected in a similar manner, and it is seen that the base electrode of transistor switch $T_N$ is coupled to output terminal $A_N$ by series-connected resistors $70_{A1}$ and $70_{A2}$; and this base electrode also is coupled to output terminal $B_N$ by series-connected resistors $70_{B1}$ and $70_{B2}$. The collector-emitter circuits of transistors $T_1$ ... $T_N$ are connected in series between a source 4 of operating potential $+V_{cc}$ and a source of reference potential, such as ground. The collector circuit of each switching transistor is provided with a respective potentiometer $VR_1$ ... $VR_N$, respectively. Thus, and as will be described, when a particular switching transistor is rendered conductive, current flows through its collector-emitter circuit so as to provide a voltage across the potentiometer connected thereto.

The adjustable tap of each potentiometer is settable, as desired, so as to provide a channel selecting voltage thereat when current flows through the potentiometer. Each channel selecting voltage represents a predetermined channel to which the tuners included in television receiver 1A and in VTR 1B are tunable. For example, the adjustable tap of potentiometer $VR_1$ may be set so that a voltage $E_1$ is produced thereat, this voltage representing channel 2. Similarly, the adjustable tap of potentiometer $VR_2$ may be set so as to produce a voltage $E_2$ thereat, this voltage being representative of channel 3. The remaining adjustable potentiometers may be similarly set so that a voltage $E_N$ produced at the adjustable tap of potentiometer $VR_N$ represents channel N. As may be appreciated, the particular setting of a potentiometer is determined by the preferences of the operator. Thus, potentiometer $VR_1$ may be set so as to produce a channel selecting voltage which represents any arbitrary channel, and need not be limited solely to the voltage $E_1$ which represents channel 2. Each adjustable tap of potentiometers $VR_1$ ... $VR_N$ is coupled via a respective oppositely poled diode to the base electrode of an emitter-follower transistor 7, this emitter-follower transistor being connected in common to all of the adjustable taps of the potentiometers. The output of emitter-follower transistor 7 is connected in common to sampling circuits 8A and 8B. The outputs of these sampling circuits are coupled via peak detectors 9A and 9B to the tuners included in television receiver 1A and in VTR 1B, respectively.

Clock generator 10 may be a free-running oscillator adapted to produce a rectangular wave pulse train having two phases $\phi_A$ and $\phi_B$. These phases alternate sequentially such that when phase $\phi_A$ is present, phase $\phi_B$ is not. Conversely, when phase $\phi_B$ is present, phase $\phi_A$ is not. Thus, phases $\phi_A$ and $\phi_B$ appear as complementary pulse trains which alternate between relatively high and low levels, respectively. Clock generator 10 additionally produces the complements of these phases $\overline{\phi_A}$ and $\overline{\phi_B}$, respectively. That is, when phase $\phi_A$ is relatively high, phase $\phi_B$ and phase $\overline{\phi_A}$ are relatively low, while phase $\overline{\phi_B}$ is relatively high. Similarly, when phase $\phi_B$ is relatively high, phases $\phi_A$ and $\overline{\phi_B}$ are relatively low, and phase $\overline{\phi_A}$ is relatively high. The number of phases in the switching signal produced by clock generator 10 is equal to the number of tuners which are controlled by the illustrated channel selecting apparatus. Since only two tuners are shown, the switching signal is described herein as containing only two phases.

The base electrodes of transistors $T_1$ ... $T_N$ are coupled via diodes $DA_1$ ... $DA_N$, respectively, to clock generator 10 for receiving phase $\phi_A$ of the switching signal. These diodes are poled such that they are conductive when phase $\phi_A$ is at its relatively low level. Diode $DA_1$ is connected to the junction defined by resistors $61_{A1}$ and $61_{A2}$. Similarly, diode $DA_2$ is connected to the junction defined by resistors $62_{A1}$ and $62_{A2}$. The remaining diodes are similarly connected, whereby diode $DA_N$ is connected to the junction defined by resistors $70_{A1}$ and $70_{A2}$.

The base electrodes of transistors $T_1$ ... $T_N$ are further connected, via diodes $DB_1$ ... $DB_N$, to clock generator 10 for receiving phase $\phi_B$ of the switching signal. These diodes are poled so as to be conductive when phase $\phi_B$ is at its relatively low level. Diode $DB_1$ is connected to the junction defined by resistors $61_{B1}$ and $61_{B2}$. Diode $DB_2$ is connected to the junction defined by resistors $62_{B1}$ and $62_{B2}$. The remaining diodes are similarly connected, whereby diode $DB_N$ is connected to the junction defined by resistors $70_{B1}$ and $70_{B2}$.

The collector electrodes of transistors $T_1$ ... $T_N$ are connected via oppositely poled diodes $D_1$ ... $D_N$ to band selecting switches $SW_1$ ... $SW_N$, respectively. Each of these band selecting switches is provided with three fixed contacts L, H and U, and a movable contact selectably engageable with any of these fixed contacts.

As may be appreciated, when a particular switching transistor is conductive, a relatively low potential is applied via band selecting switch $SW_1$ to the particular contact L, H, U with which it is in engagement. A low potential provided at contact L represents that the channel with which the switching transistor is associated and to which the tuner (either in television receiver 1A or in VTR 1B) is to be tuned is in the low band of the VHF broadcast spectrum. A low potential provided at contact H represents the channel with which the switching transistor is associated, and to which the tuner is to be tuned, is in the high band of the VHF broadcast spectrum. Finally, a low potential provided at contact U represents that the channel with which the switching transistor is associated, and to which the tuner is to be tuned, is in the UHF broadcast band.

Contacts L of band selecting switches $SW_1 \ldots SW_N$ are connected in common, and are further connected to the base electrode of transistor 5AL via a resistor 53L, and also to the base electrode of a transistor 5BL via a resistor 54L. All of the H contacts of band selecting switches $SW_1 \ldots SW_N$ are connected in common, and are further connected to the base electrode of a transistor 5AH via a resistor 53H, and also to the base electrode of a transistor 5BH via a resistor 54H. All of contacts U of band selecting switches $SW_1 \ldots SW_N$ are connected in common, and are further connected to the base electrode of transistor 5AU via a resistor 53U, and also to the base electrode of a transistor 5BU via a resistor 54U. Transistors 5AU, 5AH, 5AL, 5BU, 5BH and 5BL are PNP transistors included in a band-select signal supply circuit 5. The emitter electrodes of transistors 5AU, 5AH and 5AL are connected in common to a source of operating potential 12A; and the emitter electrodes of transistors 5BU, 5BH and 5BL are connected in common to a source of operating potential 12B. Smoothing capacitors 55U, 55H and 55L are coupled to the collector electrodes of transistors 5AU, 5AH and 5AL, respectively, and these collector electrodes are further connected to the aforementioned band selecting terminals 51U, 51H and 51L of the tuner included in television receiver 1A. Similarly, smoothing capacitors 56U, 56H and 56L are connected to the collector electrodes of transistors 5BU, 5BH and 5BL, these collector electrodes being further connected to band selecting terminals 52U, 52H and 52L, respectively, of the tuner included in VTR 1B. Phase $\overline{\phi_A}$ of the switching signal produced by clock generator 10 is coupled via a respective positively poled diode to the base electrodes of transistors 5AU, 5AH and 5AL. Similarly, phase $\overline{\phi_B}$ of the switching signal is coupled via a respective positively poled diode to the base electrodes of transistor 5BU, 5BH and 5BL.

A set of visual indicators, such as light sources which may be neon lamps, LED's, or the like, is identified as $LA_1 \ldots LA_N$. Another set of similar indicators is identified as $LB_1 \ldots LB_N$. Indicators $LA_1$ and $LB_1$ are connected in parallel between a source 11 of operating potential and the collector electrode of transistor $T_1$. Indicators $LA_2$ and $LB_2$ are connected in common between source 11 and the collector electrode of transistor $T_2$. The remaining indicators are connected in a similar manner, such that indicators $LA_N$ and $LB_N$ are connected in parallel between source 11 and the collector electrode of transistor $T_N$. A transistor 6A has its collector-emitter circuit connected in shunt relation with all of indicators $LA_1 \ldots LA_N$, and its base electrode is connected to clock generator 10 to receive phase $\overline{\phi_A}$ of the switching signal. A transistor 6B has its collector-emitter circuit connected in shunt relation with all of indicators $LB_1 \ldots LB_N$, and its base electrode connected to clock generator 10 to receive phase $\overline{\phi_B}$ of the switching signal.

In operation, clock generator 10 generates the switching signal shown by the waveforms of FIGS. 2A and 2B. It is seen that phases $\phi_A$ and $\phi_B$ are produced sequentially. During the interval $P_A$, phase $\phi_A$ is produced; and during the interval $P_B$, phase $\phi_B$ is produced. Thus, during intervals $P_A$, phase $\phi_A$ conditions diodes $DA_1 \ldots DA_N$ to be conductive. At the same time, phase $\overline{\phi_A}$ is at its relatively low level so as to render the diodes connected to the base electrodes of transistors 5AU, 5AH and 5AL non-conductive. However, since phase $\overline{\phi_B}$ also is at its relatively high level, the diodes connected to the base electrodes of transistors 5BU, 5BH and 5BL are rendered conductive. It is seen that transistor 6B is conductive when phase $\phi_A$ (and also phase $\overline{\phi_B}$) is relatively high, so as to shunt indicators $LB_1 \ldots LB_N$. However, at this time, transistor 6A is non-conductive, and none of indicators $LA_1 \ldots LA_N$ is shunted thereby.

Let it now be assumed that selector switch $SA_1$ is operated. A selector signal thus is stored in the compartment associated with switch $SA_1$, and this selector signal is provided at output terminal $A_1$ of storage circuit 3A. This selector signal is assumed to have a relatively high level; and, therefore, the remaining output terminals $A_2 \ldots A_N$ are provided with relatively low levels. Now, when phase $\phi_A$ is at its relatively high level, diode $DA_1$ is reverse-biased so as to be non-conductive. Consequently, the selector signal provided at output terminal $A_1$ is applied via resistors $61_{A1}$ and $61_{A2}$ to the base electrode of transistor $T_1$ to render this transistor conductive. At this time, phase $\phi_B$ is at its relatively low level so as to forward bias diode $DB_1$. Although current may flow therethrough, because of the selector signal applied to the base electrode of transistor $T_1$, this current flows through resistor $61_{B2}$ so as to provide a sufficient voltage drop thereacross, whereby transistor $T_1$ remains conductive.

When transistor $T_1$ conducts, current flows from source terminal 4 through potentiometer $VR_1$. Thus, a channel selecting voltage $E_1$ is produced at the adjustable tap of this potentiometer, this channel selecting voltage being less than operating voltage $V_{cc}$. Hence, the channel selecting voltage $E_1$ is supplied to the base electrode of emitter-follower transistor 7, and thence to sampling circuits 8A and 8B. Since phase $\phi_A$ is at its relatively high level, only sampling circuit 8A is operative to sample the channel selecting voltage $E_1$ supplied thereto. This sampled voltage is smoothed by peak detector 9A and is supplied to the tuner of television receiver 1A. Consequently, the tuner included in the television receiver is tuned to the channel set by channel selecting voltage $E_1$. This tuner thus is tuned to the channel which is selected by the operation of selector switch $SA_1$.

It is appreciated that, when phase $\phi_A$ is at its relatively high level, diodes $DA_2 \ldots DA_N$ are reverse biased. However, since no selector signals are provided at output terminals $A_2 \ldots A_N$, base currents do not flow in transistors $T_2 \ldots T_N$. Thus, these switching transistors remain non-conductive.

Let it be assumed that band selecting switch $SW_1$ is in engagement with contact L. Thus, when transistor $T_1$ is rendered conductive, a relatively low potential is provided from its collector electrode through diode $D_1$ to contact L, and thence through resistor 53L to the base electrode of transistor 5AL. This low potential renders transistor 5AL conductive to supply a band select signal at output terminal 51L. Consequently, the tuner included in television receiver 1A is tuned to the channel determined by channel selecting voltage $E_1$, which channel is included in the low band of the VHF broadcast spectrum.

The low potential which is provided at contact L of band selecting switch $SW_1$ also is supplied to resistor 54L. However, at this time, since phase $\phi_A$ is at its relatively high level, phase $\overline{\phi_B}$ also is at its relatively high level. This forward biases the diode which is connected to the base electrode of transistor 5BL, thereby preventing the low potential which is supplied by band selecting switch $SW_1$ from being applied to the base electrode of transistor 5BL. As a consequence thereof, this transistor remains non-conductive.

When transistor $T_1$ conducts, current flows from power source terminal 11 through indicator $LA_1$ and through the collector-emitter circuit of this transistor. Consequently, indicator $LA_1$ provides a visual indication that the channel associated with switching transistor $T_1$ has been selected, and that the tuner included in television receiver 1A is tuned to this selected channel. Current does not also flow through indicator $LB_1$ because, since phase $\phi_A$ is at its relatively high level, phase $\overline{\phi_B}$ also is at its relatively high level to render transistor 6B conductive. This latter transistor shunts all of indicators $LB_1 \ldots LB_N$, thereby preventing current from flowing through any of these shunted indicators.

If a viewer desires to change the channel to which the tuner included in television receiver 1A is tuned, any of selector switches $SA_1 \ldots SA_N$ may be operated in order to select such other channel. It is appreciated that, when another switch is so operated, a selector signal is provided at the corresponding output terminal of storage circuit 3A. When phase $\phi_A$ is at its relatively high level, transistors $T_1 \ldots T_N$ are conditioned, but only the transistor to which the selector signal is supplied is actually rendered conductive. When that transistor conducts, a channel selecting voltage is supplied from the potentiometer connected thereto to sampling circuit 8A. This channel selecting voltage is sampled in response to phase $\phi_A$, and the sampled channel selecting voltage is smoothed by peak detector 9A and supplied to the tuner included in television receiver 1A. Thus, this tuner is tuned to the channel which has been selected by the operation of the appropriate selector switch $SA_1 \ldots SA_N$. Of course, depending upon the band which is selected by the band selecting switch that is connected to the conducting transistor $T_1 \ldots T_N$, a corresponding band selecting signal is supplied to the appropriate control input 51U, 51H and 51L. Also, the one indicator $LA_1 \ldots LA_N$ which is connected to the conducting transistor provides a visual indication of the channel which had been selected and to which the tuner included in television receiver 1A is tuned.

It may be appreciated that phase $\phi_A$ is produced periodically, as shown in FIG. 2A. Thus, sampling circuit 8A periodically samples the channel selecting voltage which is supplied thereto. Peak detector 9A produces a substantially constant DC level corresponding to the samples, or periodic peaks, of the channel selecting voltage which is produced by sampling circuit 8A. Hence, even during alternate phases $\phi_B$, the proper channel selecting voltage, which is a DC level, is supplied to the tuner included in television receiver 1A.

The foregoing operation has neglected any consideration of the operation of transistors $T_1 \ldots T_N$ during alternate phases $\phi_B$. This operation now will be described in accordance with the following example wherein it is assumed that, regardless of the particular selector switch $SA_1 \ldots SA_N$ which had been operated, selector switch $SB_N$ also is operated. Accordingly, a selector signal is provided at output terminal $B_N$, but not at any other output terminal, of storage circuit 3B. This selector signal is supplied through resistors $70_{B1}$ and $70_{B2}$ to the base electrode of transistor $T_N$.

During phase $\phi_A$, it is appreciated that phase $\phi_B$ is at its relatively low level. Consequently, all of diodes $DB_1 \ldots DB_N$ are forward biased. This means that, since a selector signal is provided at output terminal $B_N$, current flows therefrom through resistor $70_{B1}$ and through diode $DB_N$. Hence, during phase $\phi_A$, no voltage is supplied to the base electrode of transistor $T_N$ from output terminal $B_N$. Therefore, this transistor is not rendered conductive during phase $\phi_A$.

During the next following phase $\phi_B$, diodes $DB_1 \ldots DB_N$ are reverse biased. Thus, the selector signal provided at output terminal $B_N$ now is applied to the base electrode of transistor $T_N$. However, because phase $\phi_A$ now is at its relatively low level, the transistor $T_1 \ldots T_N$ which had been conducting previously in response to the selector signal supplied thereto from storage circuit 3A now is rendered non-conductive because all of diodes $DA_1 \ldots DA_N$ are forward biased.

Since transistor $T_N$ is conductive, current flows through potentiometer $VR_N$, and a channel selecting voltage $E_N$ produced at its output tap is supplied through emitter-follower 7 to sampling circuits 8A and 8B. Phase $\phi_B$ is supplied only to sampling circuit 8B, and the channel selecting voltage $E_N$ supplied thereto is sampled and supplied through peak detector 9B to the tuner included in VTR 1B.

If it is assumed that band selecting switch $SW_N$ is in engagement with contact U, then a low potential is supplied from the collector electrode of conducting transistor $T_N$ through diode $D_N$ to transistors 53U and 54U. While phase $\phi_B$ is at its high level, phase $\overline{\phi_A}$ also is at its high level so as to render all of transistors 5AU, 5AH and 5AL non-conductive. However, at this time, phase $\overline{\phi_B}$ is at its low level. Consequently, the low potential supplied to resistor 54U is applied to the base electrode of transistor 5BU, thereby rendering this transistor conductive and supplying a UHF band select signal at control terminal 52U. Hence, the tuner included in VTR 1B is tuned to the channel which is set by channel selecting voltage $E_N$, and which is in the UHF band as determined by the setting of band selecting switch $S_{WN}$, all as selected by the operation of selector switch $SB_N$.

Since switching transistor $T_N$ is conductive, current flows from power source terminal 11 through indicator $LB_N$ and through the collector-emitter circuit of transistor $T_N$. Consequently, a visual indication is provided that the tuner included in VRT 1B is tuned to the channel selected by selector switch $SB_N$. Transistor 6A is conductive because phase $\phi_B$, and thus phase $\overline{\phi_A}$, is at its relatively high level. Hence, all of indicators $LA_1 \ldots LA_N$ are shunted.

FIG. 2C represents the channel selecting voltage $E_N$ which periodically is supplied to emitter-follower transistor 7 during each phase $\phi_B$. Of course, during phase $\phi_A$, since diode $DB_N$ is forward biased, transistor $T_N$ is rendered non-conductive so as to terminate channel selecting voltage $E_N$. FIG. 2C represents that, during each occurrence of phase $\phi_A$, transistor $T_1$ is conductive so as to supply channel selecting voltage $E_1$ to the emitter-follower transistor. That is, it has been assumed that storage circuit 3A stores the selector signal which had been produced in response to the operation of selector switch $SA_1$. Therefore, during each occurrence of phase $\phi_A$, channel selecting voltage $E_1$ is supplied to emitter-follower transistor 7 and is sampled by sampling circuit 8A, smoothed by peak detector 9A, as shown in FIG. 2D, and supplied to the tuner included in television receiver 1A. During each occurrence of the alternate phase $\phi_B$, transistor $T_N$ is conductive so that channel selecting voltage $E_N$ is supplied to emitter-follower transistor 7 to be sampled by sampling circuit 8B, smoothed by peak detector 9B and supplied as a substantially constant DC level (FIG. 2E) to the tuner included in VTR 1B.

It now should be appreciated that one set of potentiometers $VR_1 \ldots VR_N$, and one set of switching transistors $T_1 \ldots T_N$ are sufficient to supply multiplexed channel selecting voltages to sampling circuits 8A and 8B depending upon which selector switch included in the set of switches 2A and which selector switch included in the set of switches 2B are operated. Sampling circuits 8A and 8B serve to demultiplex these channel selecting voltages so as to supply the channel selecting voltage which is derived as a function of the operation of a selector switch $SA_1 \ldots SA_N$ to peak detector 9A, and to supply the channel selecting voltage which is derived as a function of the operation of a selector switch $SB_1 \ldots SB_N$ to peak detector 9B. If a different selector switch included in the set 2A is operated, a correspondingly different channel selecting voltage is supplied to, and demultiplexed by, sampling circuit 8A. Similarly, if a different selector switch included in the set 2B is operated, a different channel selecting voltage is supplied to, and demultiplexed by, sampling circuit 8B. Therefore, even though a single set of potentiometers is provided, the tuners included in television receiver 1A and VTR 1B are operated independently of each other. Peak detectors 9A and 9B smooth the periodic fluctuations in the channel selecting voltages which are sampled by sampling circuits 8A and 8B (FIG. 2C). These smoothed channel selecting voltages appear as shown in FIGS. 2D and 2E, and are supplied as DC levels to the respective tuners. Capacitors 55U, 55H, 55L and 56U, 56H and 56L perform a similar smoothing operation in response to the periodic fluctuations in the band select signals which are selectively produced by transistors 5AU, 5AH and 5AL; and by transitors 5BU, 5BH and 5BL.

Thus, depending upon which selector switch $SA_1 \ldots SA_N$ is operated, the tuner included in television receiver 1A is tuned to the corresponding respective frequency, and an associated indicator $LA_1 \ldots L_N$ provides a visual indication of this channel. At the very same time, and independently of the operation of the tuner included in the television receiver, depending upon which selector switch $SB_1 \ldots SB_N$ is operated, the tuner included in VTR 1B is tuned to a selected channel, and the associated indicator $LB_1 \ldots LB_N$ provides a visual indication of that selected channel. It may be appreciated that one of indicators $LA_1 \ldots LA_N$ is energized alternately with one of indicators $LB_1 \ldots LB_N$. However, if the frequency of the switching signal produced by clock generator 10 is sufficiently high, the periodic energizations of the indicators will not be perceived, and no "flicker" effect will be noticed.

Figure 3:
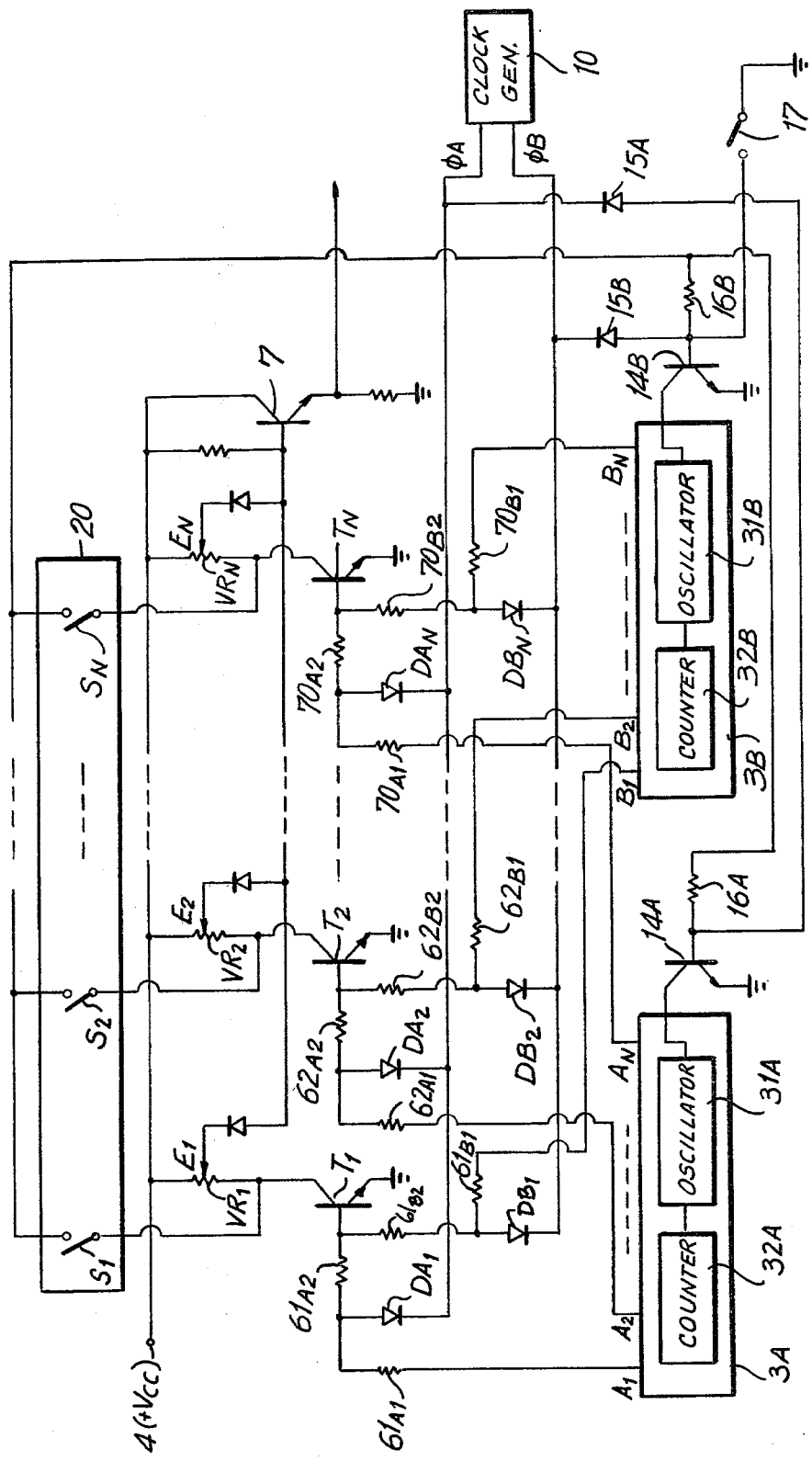
FIG. 3 is a partial block, partial schematic diagram of a portion of another embodiment of the present invention.

Another embodiment of the present invention is illustrated in FIG. 3. In the interest of simplification, television receiver 1A, VTR 1B, sampling circuits 8A and 8B, peak detectors 9A and 9B, band select signal supply circuit 5 and the visual indicators shown in FIG. 1 have been omitted from FIG. 3. It should be appreciated that these elements can be of identical construction, and connected in a similar manner as shown in FIG. 1 if used with the embodiment of FIG. 3. Switching transistors $T_1 \ldots T_N$, potentiometers $VR_1 \ldots VR_N$, diodes $DA_1 \ldots DA_N$, diodes $DB_1 \ldots DB_N$, and the various resistors connected to the base electrodes of the switching transistors are similar to these aforedescribed elements as shown in FIG. 1. The difference between the embodiment shown in FIG. 3 and that shown in FIG. 1 is that, in the FIG. 3 embodiment, only a single set 20 of selector switches $S_1 \ldots S_N$ is provided; whereas in the FIG. 1 embodiment, two sets 2A and 2B of selector switches are provided.

In FIG. 3, storage circuit 3A is comprised of a counter 32A coupled to, and driven by, an oscillator 31A, the latter being selectively turned ON or turned OFF by a transistor 14A. Counter 32A is adapted to count successive pulses supplied thereto by oscillator 31A. The count of this counter is decoded so as to supply a respective selector signal corresponding to the decoded count at a corresponding output terminal $A_1 \ldots A_N$. That is, the output terminal at which a selector signal is provided is determined by the count of counter 32A. Storage circuit 3B is of similar construction, and includes a counter 32B coupled to and driven by an oscillator 31B, the latter being selectively turned ON or turned OFF by a transistor 14B. A selector signal is provided at one of output terminals $B_1 \ldots B_N$ depending upon the particular count of counter 32B.

The base electrode of transistor 14A is coupled to clock generator 10 via an oppositely poled diode so as to be rendered non-conductive when phase $\phi_A$ is at its relatively low level (that is, while phase $\phi_B$ is at its relatively high level). The base electrode of transistor 14B is coupled via an oppositely poled diode 15B to clock generator 10 so as to be rendered non-conductive when phase $\phi_B$ is at its relatively low level.

Selector switches $S_1 \ldots S_N$ have one pole thereof connected to the collector electrode of switching transistors $T_1 \ldots T_N$, respectively, and the other pole thereof is connected in common to the base electrodes of transistors 14A and 14B via resistors 16A and 16B, respectively.

An inhibit switch 17 is coupled to the base electrode of transistor 14B and is adapted, when closed, to supply ground potential to this transistor.

In operation, let it be assumed that inhibit switch 17 is opened. Let it be further assumed that it is desired to tune the tuners included in television receiver 1A and in VTR 1B to channel N. Accordingly, selector switch $S_N$ is closed. If the counts of counters 32A and 32B do not correspond to channel N, then a selector signal is not supplied either at output terminal $A_N$ or at output terminal $B_N$. Consequently, transistor $T_N$ remains non-conductive even when this transistor is conditioned by phases $\phi_A$ and $\phi_B$ produced by clock generator 10. Now, when selector switch $S_N$ is operated, the relatively high potential provided at the collector electrode of non-conducting transistor $T_N$ is supplied via resistors 16A and 16B to transistors 14A and 14B, respectively. If it is assumed that the switching pulse produced by clock generator 10 exhibits phase $\phi_A$, then diode 15A is reverse biased and diode 15B is forward biased. Consequently, diode 15B shunts the relatively high potential supplied to resistor 16B by switch $S_N$, thereby turning transistor 14B OFF. However, transistor 14A receives the high potential supplied from switch $S_N$ and, therefore, is turned ON. Oscillator 31A thus is enabled to supply pulses to counter 32A, whereby the count of this counter is incremented. Let it be assumed that the frequency of the pulses produced by oscillator 31A is sufficiently high such that counter 32A is incremented to apply successive selector signals at output terminals $A_1 \ldots A_N$ during the interval $P_A$. Thus, while phase $\phi_A$ is at its relatively high level, counter 32A will reach the count whereby the selector signal is provided at output terminal $A_N$. Thus, regardless of the output terminal $B_1 \ldots B_N$ at which a selector signal is provided at this time, the joint occurrence of phase $\phi_A$ and a selector signal at output terminal $A_N$ renders transistors $T_N$ conductive.

When transistor $T_N$ conducts, the potential at its collector electrode is reduced to a relatively low level. This low level is supplied through selector switch $S_N$ to resistor 16A. Hence, transistor 14A is turned OFF, and oscillator 31A is disabled. The count of counter 32A thus remains fixed so as to maintain the selector signal at output terminal $A_N$.

At the completion of phase $\phi_A$, phase $\phi_B$ is at its relatively high level. Thus, diode $DA_N$ is forward biased by the relatively low level of phase $\phi_A$. This prevents the selector signal at output terminal $A_N$ from being supplied to transistor $T_N$. Therefore, transistor $T_N$ is rendered non-conductive, resulting in a relatively high potential at its collector electrode. This high potential now is supplied through selector switch $S_N$ to resistor 16B. Since diode 15B now is reverse biased by the relatively high level of phase $\phi_B$, the high potential supplied to resistor 16B results in a base current to turn transistor 14B ON. Accordingly, oscillator 31B is enabled to supply pulses to counter 32B, thereby incrementing the count thereof. It is assumed that the frequency of oscillator 31B is sufficiently high such that the count of counter 32B can be incremented to supply a selector signal sequentially to output terminals $B_1 \ldots B_N$ during the interval $P_B$. Therefore, while phase $\phi_B$ is at its relatively high level, counter 32B will reach the count whereby a selector signal is provided at output terminal $B_N$. It is appreciated that the joint occurrence of phase $\phi_B$ and a selector signal at output terminal $B_N$ renders transistor $T_N$ conductive. When this transistor conducts, a relatively low potential is provided at its collector electrode, which low potential is supplied through switch $S_N$ to resistor 16B. Therefore, transistor 14B is turned OFF to disable oscillator 31B. As a consequence thereof, the count of counter 32B remains fixed so as to maintain the selector signal at output terminal $B_N$.

Now, since a selector signal is provided at output terminal $A_N$ of storage circuit 3A, it is recognized that transistor $T_N$ is rendered conductive upon each occurrence of phase $\phi_A$. Accordingly, during each occurrence of phase $\phi_A$, the channel selector voltage $E_N$, which is determined by the setting of potentiometer $VR_N$, is supplied through emitter-follower transistor 7 to sampling circuits 8A and 8B (FIG. 1). This channel selecting voltage $E_N$ is sampled by sampling circuit 8A and smoothed by peak detector 9A to be supplied as a DC level to the tuner included in television receiver 1A. Thus, the tuner included in the television receiver is tuned to channel N, as determined by the operation of selector switch $S_N$.

Similarly, since a selector signal is provided at output terminal $B_N$ of storage circuit 3B, transistor $T_N$ is rendered conductive upon each occurrence of phase $\phi_B$. When this switching transistor conducts, channel selecting voltage $E_N$, which is produced by the setting of potentiometer $VR_N$, is supplied via emitter-follower transistor 7 to sampling circuits 8A and 8B. This channel selecting voltage is sampled by sampling circuit 8B, smoothed by peak detector 9B and supplied to the tuner included in VTR 1B. Thus, the tuner included in this VTR is tuned to channel N, as selected by the operation of selector switch $S_N$.

It is seen that, in the embodiment of FIG. 3, one set of selector switches, i.e., either the set 2A or the set 2B, can be omitted. This provides a further reduction in the cost of the channel selecting apparatus. When a single set of selector switches is provided, the tuners included in television receiver 1A and in VTR 1B are tuned to the same channel. This is a desirable feature when a viewer wishes to select a particular channel for recording. Thus, by operating a single selector switch, the channel which is being received by the VTR can be monitored by the television receiver. Let it now be assumed that the viewer wishes to record information which is received over the selected channel. Accordingly, a suitable RECORD switch (not shown) is closed. Preferably, inhibit switch 17 is ganged to this RECORD switch so that the inhibit switch likewise is closed. When inhibit switch 17 is closed, ground potential is supplied to the base electrode of transistor 14B, thereby keeping this transistor OFF. Hence, oscillator 31B is maintained disabled so that further pulses cannot be supplied to increment counter 32B. This means that the selector signal which had been previously provided at output terminal $B_N$ is maintained thereat. Therefore, the tuner included in VTR 1B is "locked" to channel N.

If the viewer now wishes to tune the tuner included in television receiver 1A to a different channel, such as the channel associated with selector switch $S_2$, this selector swtich now may be operated. Since selector signals had been provided at output terminals $A_N$ and $B_N$, it is appreciated that, when selector switch $S_2$ is closed, switching transistor $T_2$ remains non-conductive regardless of the phase of the switching signal produced by clock generator 10. Consequently, a relatively high potential is provided at the collector electrode of transistor $T_2$, and this high potential is supplied through switch $S_2$ to resistors 16A and 16B. Since inhibit switch 17 is closed, a voltage drop is provided across resistor 16B so as to maintain transistor 14B OFF. Hence, oscillator 31B remains disabled; and the count of counter 32B remains fixed. Thus, the selector signal is retained at output terminal $B_N$. Therefore, whenever phase $\phi_B$ is at its relatively high level, transistor $T_N$ is rendered conductive to supply channel selecting voltage $E_N$ through emitter-follower transistor 7 to sampling circuit 8B.

However, when phase $\phi_A$ is at its relatively high level, diode 15A is reverse so that the high potential supplied to resistor 16A from selector switch $S_2$ is applied to the base electrode of transistor 14A to turn this transistor ON. Acccordingly, oscillator 31A is enabled to supply pulses to counter 32A. The count of this counter is incremented until a selector signal is provided at output terminal $A_2$. This selector signal occurs jointly with the occurence of phase $\phi_A$ at its high level, thereby rendering transistor $T_2$ conductive. As a consequence thereof, the potential at the collector electrode of transistor $T_2$ is reduced to a relatively low level, and this low potential is supplied through switch $S_2$ to transistor 14A, thereby turning this transistor OFF. Oscillator 31A now is disabled from supplying further pulses to counter 32A. Hence, the count of this counter remains fixed, and the selector signal is maintained at output terminal $A_2$. Therefore, during each occurrence of phase $\phi_A$, transistor $T_2$ is rendered conductive to supply the channel selector voltage $E_2$ through emitter-follower transistor 7 to sampling circuit 8A.

Thus, it is seen that, when inhibit switch 17 is closed, the tuner included in VTR 1B is tuned to the channel selected by channel selecting voltage $E_N$, and the tuner included in television receiver 1A is tuned to the channel selected by channel selector voltage $E_2$. During each sampling interval $P_A$, sampling circuit 8A samples the channel selector voltage $E_2$, and these periodic samples are smoothed by peak detector 9A to supply a constant DC level $E_2$ to the tuner included in the television receiver. During sampling intervals $P_B$, sampling circuit 8B samples channel selector voltage $E_N$; and peak detector 9B smoothes these periodic samples to supply a constant DC level $E_N$ to the tuner included in the VTR. Therefore, these tuners are tuned to different channels, even though only a single set of potentiometers and a single set of selector switches are provided.

Let it be assumed that, either with the embodiment shown in FIG. 1 or with the embodiment shown in FIG. 3, the tuners included in the television receiver and in the VTR are to be tuned to the same channel. This means that, during each occurrence of phase $\phi_A$, a particular switching transistor is rendered conductive, and during each occurrence of phase $\phi_B$, the very same switching transistor is rendered conductive. Hence, the same channel selector voltage is supplied by emitter-follower transistor 7 to sampling circuits 8A and 8B during phase $\phi_A$ and during phase $\phi_B$. Thus, the same DC levels are applied to the tuners included in the television receiver and in the VTR by peak detectors 9A and 9B. However, in certain circumstances, the characteristics of the respective voltage-controlled capacitors may differ from each other. This means that if the particular voltage is supplied to one voltage-controlled capacitor so as to establish a particular tuning condition, that very same voltage, if supplied to the other voltage-controlled capacitor, may establish a different tuning condition. This possibility is overcome if the potentiometers $VR_1$ ... $VR_N$ used in the embodiments of FIGS. 1 and 3 are replaced by the potentiometers shown in FIG. 4.

As illustrated, each of the previously described potentiometers is replaced by a pair of parallel-connected potentiometers. Thus, potentiometer $VR_1$ is replaced by parallel-connected potentiometers $MV_1$ and $SV_1$; potentiometer $VR_2$ is replaced by parallel-connected potentiometers $MV_2$ and $SV_2$, and so on. Each potentiometer designated MV is referred to as the main potentiometer, and each potentiometer designated SV is referred to as the auxiliary, or sub, potentiometer. The auxiliarly potentiometers are similar to trimmer resistors. The outputs of all of the main potentiometers $MV_1$ ... $MV_N$ are connected in common to a main emitter-follower transistor 7M. Similarly, the outputs of the all of the auxiliary potentiometers $SV_1$ ... $SV_N$ are connected in common to an auxiliary emitter-follower transistor 7S. Bias resistors are provided between the base electrodes of each of the main and auxiliary emitter-follower transistors and power source terminal 4.

The emitter electrode of main emitter-follower transistor 7M is coupled to ground by an emitter load resistor 18. Similarly, the emitter electrode of auxiliary emitter-follower transistor 7S is coupled to ground by an emitter load resistor 19. Resistors 20 and 21 are connected in series between the emitter electrodes of these main and auxiliary emitter-follower transistors. The junction defined by resistors 20 and 21 is connected to sampling circuit 8B. The emitter of main emitter-follower transistor 7M is connected to sampling circuit 8A. These sampling circuits are the same as aforedescribed sampling circuits 8A and 8B.

Let it be assumed that the channel selector voltage which is supplied to main emitter-follower transistor 7M when a switching transistor is rendered conductive is represented as $E_M$. Let it be further assumed that the auxiliary channel selector voltage which is supplied to the auxiliary emitter-follower transistor 7S when one of the switching transistors is rendered conductive is represented as $E_S$. Thus, the emitter voltages produced at the emitter electrodes of main and auxiliary emitter-follower transistors 7M and 7S are equal to $E_M$ and $E_S$, respectively. If the resistances of resistors 20 and 21 are equal to $R_1$ and $R_2$, respectively, then the voltage obtained at the junction defined by these resistors is equal to $(R_1 E_S + R_2 E_M)/(R_1 + R_2)$. Hence, the channel selector voltage supplied to sampling circuit 8A differs from the channel selector voltage supplied to sampling circuit 8B by the voltage differential across resistor 20, which voltage differential is equal to $\pm |E_S - E_M|(R_1/R_1 + R_2)$. By suitably selecting the settings of the respective auxiliary potentiometers, and by suitably choosing resistors 20 and 21, it is seen that, if the same switching transistor is rendered conductive during phase $\phi_A$ and during phase $\phi_B$, thus representing that both tuners are to be tuned to the same channel, different channel selector voltages are sampled by sampling circuits 8A and 8B. Consequently, the voltage which is applied to the voltage-controlled capacitor in one tuner will differ from the voltage which is supplied to the voltage-controlled capacitor in the other tuner. Thus, because of the different characteristics of these voltage-controlled capacitors, the fact that different, or compensated, channel selector voltages are supplied thereto means that both tuners can be tuned to the very same channel. Thus, the aforenoted problem of tuning the respective tuners to different channels, or frequencies, even though the very same channel selector voltages are supplied thereto, is avoided.

In the embodiments of FIGS. 1 and 3, only a single set of potentiometers is needed. Heretofore, when individual sets of potentiometers have been provided for the respective tuners, it was necessary for an operator to set each potentiometer so as to produce the desired channel selector voltage. By reducing the number of potentiometers by half, it is seen that this so-called setting-up operation is significantly simplified.

While the present invention has been particularly shown and described with reference to certain preferred embodiments, it should be readily apparent that various changes and modifications in form and details can be made by one of ordinary skill in the art without departing from the spirit and scope of the invention. For example, switching transistors $T_1$ ... $T_N$ need not be limited solely to the configuration illustrated herein.

The collector-emitter circuits of these transistors, instead of being connected in series with the potentiometers, may, alternatively, be connected between the output tap of the respective potentiometers and the emitter-follower transistor. As another alternative, each switching transistor may be selectively rendered conductive by either of two different gating circuits connected thereto. One gating circuit can be provided with an input connected to a predetermined output terminal of storage circuit 3A and another input which is conditioned by phase $100_A$. The other gating circuit may have one input connected to a predetermined output terminal of storage circuit 3B and another input conditioned by phase $\phi_B$. Still further, the present invention can be utilized with more than two tuners. Clock generator 10 should provide a switching signal having at least the same number of phases as the number of tuners. Thus, the channel selector voltages produced by the respective potentiometers will be combined in time-division fashion so as to be sequentially supplied to the various sampling circuits.

It is intended that the appended claims be interpreted as including the foregoing as well as various other such changes and modifications.

What is claimed is:

1. Channel selecting apparatus for use with at least first and second tuning devices, each tuning device being responsive to a channel selecting signal supplied thereto for being tuned to a corresponding frequency, said channel selecting apparatus comprising:
    at least first and second selector means for producing first selector signals representing those channels to which said first tuning device is tunable and second selector signals representing those channels to which said second tuning device is tunable, respectively;
    a set of adjustable elements common to said at least first and second turning devices, each adjustable element being settable to produce a respective channel selecting signal;
    means for generating a switching signal having at least first and second phases in sequence;
    at least first and second sampling means associated with said at least first and second tuning devices, respectively, said first sampling means being responsive to the first phase of said switching signal to sample a channel selecting signal applied thereto, and said second sampling means being responsive to the second phase of said switching signal to sample a channel selecting signal applied thereto;
    a set of switch means, each being coupled to a respective one of said adjustable elements and to receive a respective first selector signal and a respective second selector signal, each switch means being conditioned by said first phase of said switching signal to enable the channel selecting signal produced by the adjustable element coupled thereto to be applied to said first sampling means if a first selector signal is supplied thereto, and each switch means being conditioned by said second phase of said switching signal to enable the channel selecting signal produced by said adjustable element coupled thereto to be applied to said second sampling means if a second selector signal is supplied thereto; and
    means for applying the channel selecting signals sampled by said at least first and second sampling means to said at least first and second tuning devices, respectively.

2. The channel selecting apparatus of claim 1 wherein said at least first and second selector means comprises at least first and second sets of selector switches, the selector switches in a set each being mutually exclusively operable and each being associated with a predetermined channel; and at least first and second memory means coupled to said at least first and second sets of selector switches, each memory means storing a selector signal corresponding to the operated selector switch in a set.

3. The channel selecting apparatus of claim 2 wherein each memory means includes an output terminal for each respective selector signal, each output terminal being coupled to a corresponding one of said switch means.

4. The channel selecting apparatus of claim 1 wherein said at least first and second selector means comprises a set of selector switches common to said at least first and second tuning devices, each selector switch being mutually exclusively operable to select a predetermined channel; at least first and second counter means for generating said first and second selector signals, respectively, each counter means including an output terminal for each respective selector signal, each output terminal being coupled to a corresponding one of said switch means; means for selectively incrementing said at least first and second counter means; and means for inhibiting said counter means from being further incremented when a selector signal generated thereby represents the same channel which is selected by a selector switch.

5. The channel selecting apparatus of claim 4 wherein said means for selectively incrementing said at least first and second counter means comprises first means responsive to said first phase of said switching signal to increment said first counter means, and second means responsive to said second phase of said switching signal to increment said second counter means.

6. The channel selecting apparatus of claim 5 wherein said means for selectively incrementing said at least first and second counter means further comprises means for providing first and second count pulses to said first and second counter means, respectively; and wherein said first and second means comprises first and second switching elements, respectively, said first switching element being conditioned by said first phase of said switching signal to enable said first count pulses to be supplied to said first counter means and said second switching element being conditioned by said second phase of said switching signal to enable said second count pulses to be supplied to said second counter means.

7. The channel selecting apparatus of claim 6 wherein each selector switch is connected to a respective, predetermined switch means for sensing when said predetermined switch means enables a channel selecting signal to be applied to a sampling means so as to de-condition said first and second switching elements and thereby prevent said first and second count pulses from being supplied to said first and second counter means.

8. The channel selecting apparatus of claim 7 further comprising an inhibit switch coupled to one of said switching elements to de-condition said one switching element and thereby prevent count pulses from being supplied to a corresponding one of said counter means, whereby the selector signal generated by said one counter means remains fixed and the channel selecting signal produced by the adjustable element coupled to the switch means which receives said fixed selector signal is applied to the sampling means which is associated with said one counter means; and whereby any selector switch may thereafter be operated to cause said other counter means to be incremented to generate a selector signal for enabling a corresponding channel selecting signal to be applied to said other sampling means.

9. The channel selecting apparatus of claim 1 wherein said set of adjustable elements comprises a set of potentiometers.

10. The channel selecting apparatus of claim 9 wherein said set of switch means comprises a set of transistor switches, each transistor switch being connected in series with a respective potentiometer to enable a channel selecting signal to be produced at the output of said series-connected potentiometer when said transistor switch is conductive.

11. The channel selecting apparatus of claim 10 wherein a transistor switch is rendered conductive in response to a selector signal supplied thereto from said first selector means only if said switching signal exhibits its first phase, and wherein said transistor switch is rendered conductive in response to a selector signal supplied thereto from said second means only if said switching signal exhibits its second phase.

12. The channel selecting apparatus of claim 11 wherein the outputs of all of said potentiometers are connected in common to said first and second sampling means.

13. The channel selecting apparatus of claim 11 further comprising a first set of light indicators, each of which is connected in series with a respective transistor switch; a second set of light indicators, each of which is connected in series with a respective transistor switch; and indicator control means coupled to said first and second sets of light indicators and responsive to said first phase of said switching signal to enable the light indicator connected with a conductive transistor to indicate the channel to which said first tuning device is tuned, said indicator control means being responsive to said second phase of said switching signal to enable the light indicator connected with a conductive transistor to indicate the channel to which said second tuning device is tuned.

14. The channel selecting apparatus of claim 1 wherein said means for applying the channel selecting signals sampled by said first and second sampling means to said first and second tuning devices comprises first and second peak detecting means coupled to said first and second sampling means, respectively, for supplying substantially constant DC levels of said sampled channel selecting signals to said first and second tuning devices.

15. The channel selecting apparatus of claim 1 wherein said set of adjustable elements comprises a set of main potentiometers, each of which is coupled to a respective one of said switch means, and all of said main potentiometers having outputs coupled in common to said first and second sampling means; and a set of auxiliary potentiometers, each of which is coupled to a respective one of said switch means, and all of said auxiliary potentiometers having outputs coupled in common to said first and second sampling means.

16. The channel selecting apparatus of claim 15 further comprising compensating means for coupling the outputs of said main and auxiliary potentiometers to said first and second sampling means such that the amplitudes of the channel selecting signals supplied to said first and second sampling means differ even if the same selector signals are produced by said first and second selector means.

17. The channel selecting apparatus of claim 1 wherein said first and second tuning devices are television tuners capable of being tuned to low band, high band and UHF band channels, and further comprising a set of band selecting switches, each coupled to a respective one of said switch means to selectively produce a low-band, high-band or UHF-band selector signal when said respective switch means enables a channel selecting signal to be applied to said first or second sampling means; and at least first and second band selector signal supply means, each coupled to said set of band selecting switches for supplying the produced low-band, high-band or UHF-band selector signals to said at least first and second tuning devices in response to said at least first and second phases, respectively, of said switching signal.

* * * * *